United States Patent
Chuang et al.

(10) Patent No.: US 10,256,203 B2
(45) Date of Patent: Apr. 9, 2019

(54) SEMICONDUCTOR DEVICE AND SEMICONDUCTOR PACKAGE

(71) Applicant: Taiwan Semiconductor Manufacturing Co., Ltd., Hsinchu (TW)

(72) Inventors: Lipu Kris Chuang, Hsinchu (TW); Han-Ping Pu, Taichung (TW); Hsin-Yu Pan, Taipei (TW); Sen-Kuei Hsu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/662,261

(22) Filed: Jul. 27, 2017

(65) Prior Publication Data

US 2019/0035752 A1    Jan. 31, 2019

(51) Int. Cl.
*H01L 23/00*    (2006.01)
*H01L 23/31*    (2006.01)
(Continued)

(52) U.S. Cl.
CPC .......... *H01L 24/06* (2013.01); *H01L 23/3114* (2013.01); *H01L 23/3677* (2013.01); *H01L 23/5383* (2013.01); *H01L 23/5384* (2013.01); *H01L 23/5386* (2013.01); *H01L 23/5389* (2013.01); *H01L 23/42* (2013.01); *H01L 2224/06519* (2013.01); *H01L 2224/09519* (2013.01); *H01L 2224/14519* (2013.01);
(Continued)

(58) Field of Classification Search
CPC . H01L 2224/06519; H01L 2224/09519; H01L 2224/14519; H01L 2224/17519; H01L 2224/20519; H01L 2224/33519; H01L 23/42; H01L 23/5386; H01L 2924/351
See application file for complete search history.

(56) References Cited

U.S. PATENT DOCUMENTS

| | | | | |
|---|---|---|---|---|
| 4,764,804 | A | * | 8/1988 | Sahara ............... H01L 23/24 174/16.3 |
| 6,468,894 | B1 | * | 10/2002 | Yang ............. H01L 21/76802 257/E21.576 |

(Continued)

*Primary Examiner* — David A Zarneke
(74) *Attorney, Agent, or Firm* — JCIPRNET

(57) ABSTRACT

A semiconductor package includes a die, a passivation layer, a plurality of first electrical conductive vias, a plurality of second electrical conductive vias, a plurality of thermal conductive vias and a connecting pattern. The die includes a plurality of first pads and a plurality of second pads. The passivation layer is disposed on the die. The first electrical conductive vias and the second electrical conductive vias extend through the passivation layer and contact the first pads and the second pads respectively. The thermal conductive vias are disposed on the passivation layer. Each of the thermal conductive vias is spaced apart from the first and second electrical conductive vias. The connecting pattern is disposed on the passivation layer and connects the first electrical conductive vias and the thermal conductive vias. The thermal conductive vias are connected to the first pads through the connecting pattern and the first electrical conductive vias.

20 Claims, 10 Drawing Sheets

(51) Int. Cl.
    *H01L 23/42*     (2006.01)
    *H01L 23/367*    (2006.01)
    *H01L 23/538*    (2006.01)

(52) U.S. Cl.
    CPC .............. *H01L 2224/17519* (2013.01); *H01L 2224/30519* (2013.01); *H01L 2224/33519* (2013.01); *H01L 2924/351* (2013.01)

(56) References Cited

U.S. PATENT DOCUMENTS

| | | | | |
|---|---|---|---|---|
| 7,224,069 B2* | 5/2007 | Chen | ..................... | H01L 23/562 257/774 |
| 7,838,988 B1* | 11/2010 | Gurrum | .............. | H01L 23/3171 257/720 |
| 8,174,124 B2* | 5/2012 | Chiu | ................... | H01L 21/6835 257/621 |
| 8,294,261 B2* | 10/2012 | Mawatari | ............ | H01L 23/3677 257/712 |
| 8,581,400 B2* | 11/2013 | Liang | .................. | H01L 23/3192 257/707 |
| 9,082,761 B2* | 7/2015 | Chuang | ................... | H01L 21/56 |
| 9,515,002 B2* | 12/2016 | Gandhi | ............... | H01L 23/3677 |
| 2015/0214192 A1* | 7/2015 | Lin | ........................ | H01L 24/83 257/737 |
| 2015/0221612 A1* | 8/2015 | Gandhi | ............... | H01L 25/0657 257/753 |
| 2018/0197831 A1* | 7/2018 | Kim | ........................ | H01L 23/13 |

* cited by examiner ic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
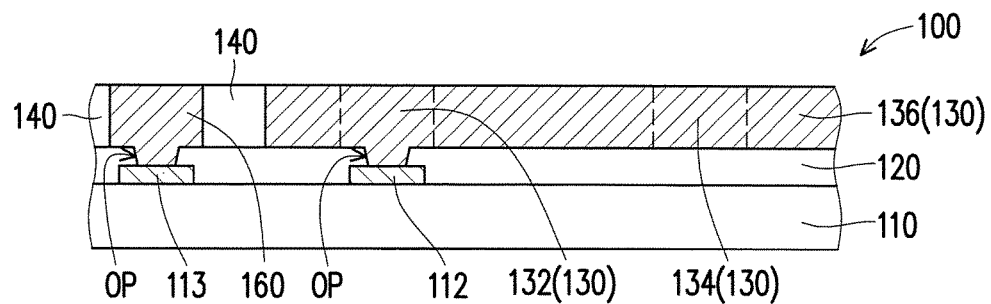
FIG. 1 illustrates a schematic cross sectional view of a semiconductor device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 is a schematic cross sectional view of a semiconductor device according to some exemplary embodiments of the present disclosure. FIG. 2A to FIG. 2F illustrate schematic plan views of semiconductor devices according to some exemplary embodiments of the present disclosure. It is noted that FIG. 1 illustrates the cross sectional view of the semiconductor device 100 in FIG. 2A along cross-sectional line A-A'. Referring to FIG. 1 and FIG. 2, in exemplary embodiments, a semiconductor device 100 may include a die 110, a passivation layer 120, a conductive frame 130 and a plurality of third vias 160. The die 110 may include a plurality of first pads 112 and a plurality of second pads 113. In some embodiment, the first pads 112 may be the power pads of the die 110, which may be connected to the $V_{dd}$ power supply line of the die 110, and the second pads 113 may be the signal pads of the die 110. The passivation layer 120 is disposed on the die 110 and includes a plurality of openings OP for exposing the first pads 112 and the second pads 113. The conductive frame 130 is disposed on the passivation layer 120 as shown in FIG. 2A to FIG. 2F. The conductive frame 130 includes a plurality of first vias 132 and a plurality of second vias 134. In some embodiments, the semiconductor device 100 may further include another passivation layer 140 disposed on the passivation layer 120 and may or may not expose the first vias 132 and the second vias 134. It is noted that the passivation layer 140 disposed on the passivation layer 120 are omitted in FIG. 2A to FIG. 2F for better illustrating the layout of the metal frame 130 on the passivation layer 120.

In some embodiments, the first vias 132 and the third vias 160 are disposed at the openings OP. The first vias 132 contact the first pads 112 respectively and the third vias 160 contact the second pads 113 respectively through the openings OP. In other words, the first vias 132 and the third vias 160 penetrate the passivation layer 120 through the openings OP to contact the first pads 112 and the second pads 113. In some embodiments, the second vias 134 are disposed on top of the passivation layer 120 without penetrating the passivation layer 120. Each of the second vias 134 maintains a distance from a closest one of the openings OP. That is to say, the second vias 134 are not filled in the openings OP to be directly connected to the first pads 112. The distances between the second vias 134 and the openings OP may or may not be the same. In some embodiments, the first vias 132 and the second vias 134 are interconnected through a connecting pattern 136. Accordingly, the first vias 132, the second vias 134 and the connecting pattern 136 may form the conductive frame 130 as shown in FIG. 2A to FIG. 2F. In one embodiment, the first vias 132 may be a plurality of first electrical conductive vias for directly connecting the first pads 112 of the die 110. The third vias 160 may be a plurality of second electrical conductive vias for directly connecting the second pads 113 of the die 110. The second vias 134 may be thermal conductive vias for being connected to the first pads 112 through the connecting pattern 136 and the first vias 132 of the conductive frame 130 to help dissipating the heat from the die 110. In one embodiment, the first vias 132 are disposed right above the first pads 112 respectively. Namely, the second vias 134 on the passivation layer 120 are not superimposed with the first pads 112, but are merely indirectly connected to the first pads 112 through the connecting pattern 136 and the first vias 132.

In exemplary embodiments, the semiconductor device 100 may further include a plurality of fourth vias 150, which are isolated from the conductive frame 130 as shown in FIG. 2A to FIG. 2F. It is noted that, in FIG. 2A to FIG. 2F, the circles depicted in thin lines represent the first vias 132 (and the third vias 160 in FIG. 2A), the circles depicted in thick lines represent the second vias 134, and the circles depicted in dotted lines represent the fourth vias 150. In some embodiments, the fourth vias 150 may be ground vias configured to contact a plurality of ground pads, e.g. the ground pads 114 shown in FIG. 3A to FIG. 3C, of the die 110. In one embodiment, the fourth vias 150 may be surrounded by the first vias 132. It is noted that the layout of the fourth vias 150 shown in FIG. 2A to FIG. 2F is merely for illustration purpose. The disposition of the fourth vias 150 is not limited thereto.

Figure 2A:
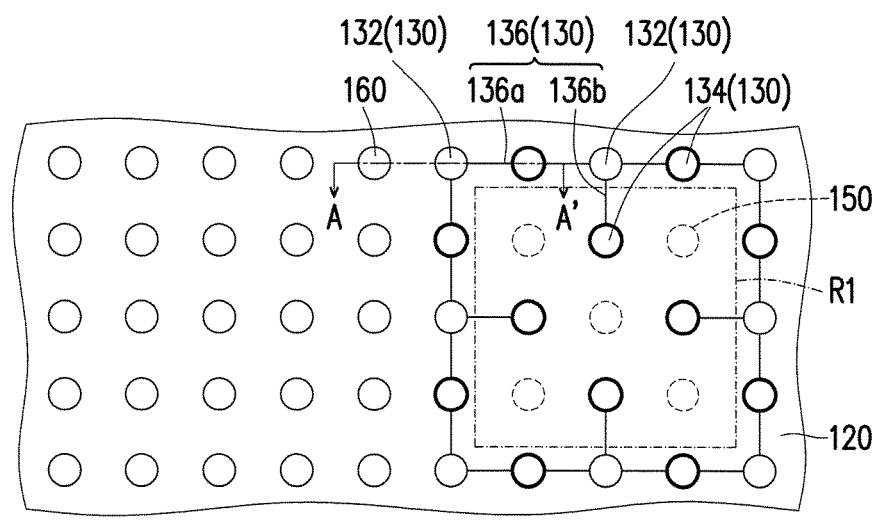
FIG. 2A to FIG. 2F illustrate schematic plan views of semiconductor devices according to some exemplary embodiments of the present disclosure.

Referring to FIG. 2A, in the embodiment, the first vias 132 and a first set of the second vias 134 surrounds a region R1 of the passivation layer 120, and a second set of the second vias 134 are disposed within the region R1 and surrounded by the first vias 132 and the first set of the second vias 134. Accordingly, the conductive frame 130 surrounds the region R1 of the passivation layer 120 to connect the first vias 132 and the first set of the second vias 134, and extends toward a center of the region R1 to connect the second set of the second vias 134 as shown in FIG. 2A. In some embodiments, the connecting pattern 136 may further include a first connecting pattern 136a and a second connecting pattern 136b. The first connecting pattern 136a surrounds the region R1 of the passivation layer 120 to connect the first vias 132 and the first set of the second vias 134. The second connecting pattern 136b connects the first vias 132 and the second set of the second vias 134 disposed within the region R1. With the configuration, the metal density distributed on the passivation layer 120 may be increased, so as to improve the heat dissipation efficiency of the semiconductor device. It is noted that the layout of the conductive frame 130 shown in FIG. 2 merely for illustration purpose. The dispositions of the first vias 132, the second vias 134 and the connecting pattern 136 are not limited thereto.

It is noted that each of the semiconductor devices 100 shown in FIG. 2B to FIG. 2F contains many features same as or similar to the semiconductor device 100 disclosed earlier with FIG. 2A. For purpose of clarity and simplicity, detail description of same or similar features may be omitted, and the same or similar reference numbers denote the same or like components. In addition, the disposition of the third vias 160 are omitted in FIG. 2B to FIG. 2F for simplicity of the drawings, and the disposition of the third vias 160 is not limited to the disclosure. The main differences between the semiconductor device 100 shown in FIG. 2A and each of the semiconductor devices 100 shown in FIG. 2B to FIG. 2F are described as follows.

Figure 2B:
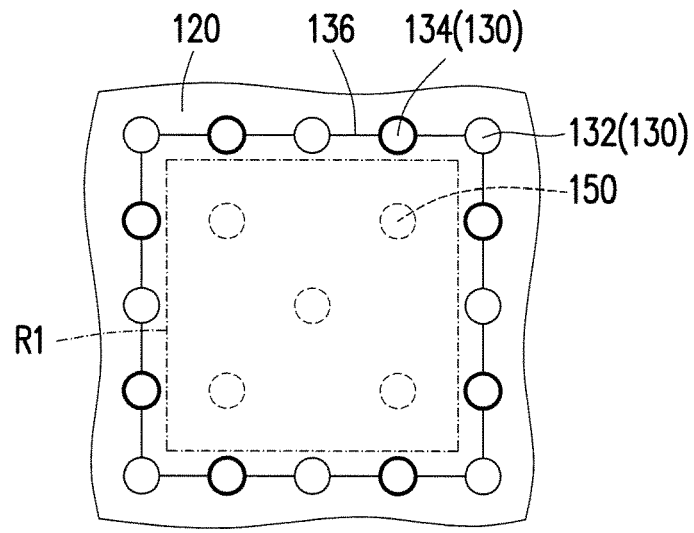

Referring to FIG. 2B, in the embodiment, the first vias 132 and the second vias 134 are together surrounds the region R1 of the passivation layer 120. As such, the connecting pattern 136 of the conductive frame 130 surrounds the region of the passivation layer 120 to connect the first vias 132 and the second vias 134.

Figure 2C:
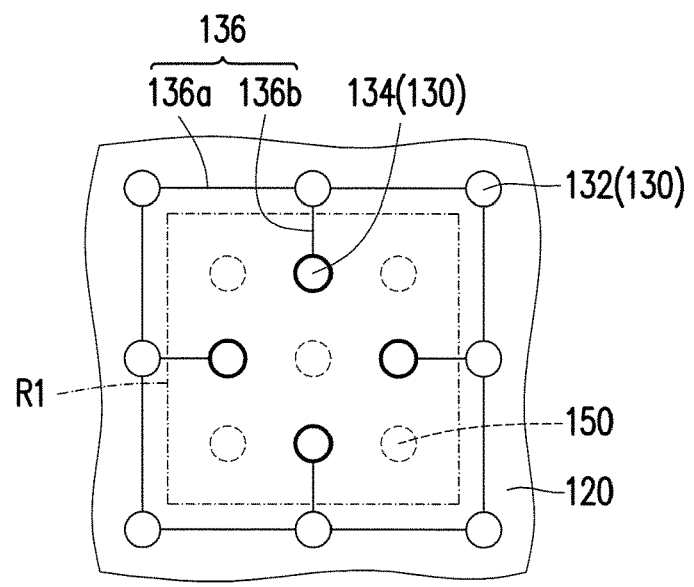

Referring to FIG. 2C, in the embodiment, the first vias 132 surrounds the region R1 of the passivation layer 120 while at least some of the second vias 134 are disposed within the region R1 and surrounded by the first vias 132. As such, the first connecting pattern 136a surrounds the region R1 of the passivation layer 120 to connect the first vias 132, and the second connecting pattern 136b extends toward the center of the region R1 to connect the first vias 132 and the second vias 134.

Figure 2D:
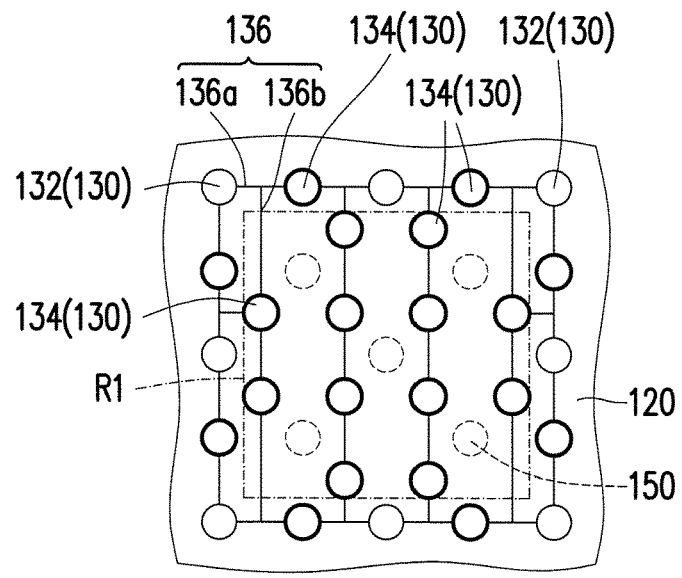

Referring to FIG. 2D, in the embodiment, the first vias 132 and a first set of the second vias 134 surrounds the region R1 of the passivation layer 120 while a second set of the second vias 134 are disposed within the region R1 and surrounded by the first vias 132 and the first set of the second vias 134. As such, the first connecting pattern 136a surrounds the region R1 of the passivation layer 120 to connect the first vias 132 and the first set of the second vias 134. The second connecting pattern 136b extends toward the center of the region R1 for connecting between the first connecting pattern 136a and the second set of the second vias 134.

Figure 2E:
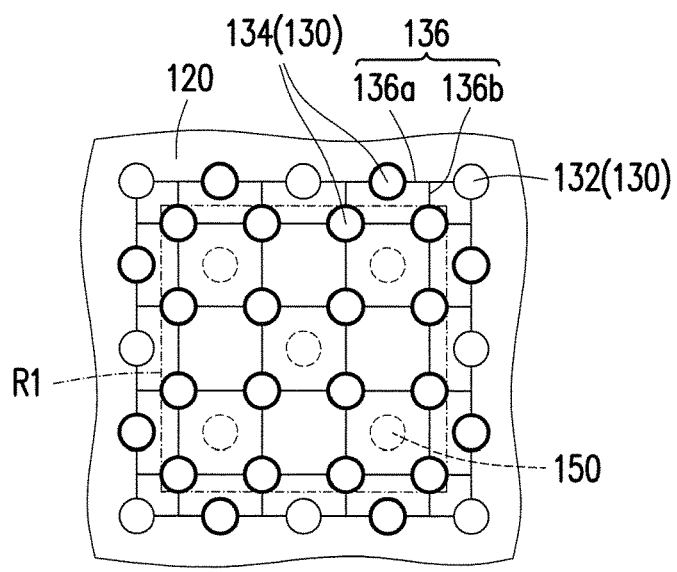

Referring to FIG. 2E, in the embodiment, the first vias 132 and a first set of the second vias 134 surrounds the region R1 of the passivation layer 120 while a second set of the second vias 134 are disposed within the region R1 and surrounded by the first vias 132 and the first set of the second vias 134. As such, the first connecting pattern 136a surrounds the region R1 of the passivation layer 120 to connect the first vias 132 and the first set of the second vias 134. The second connecting pattern 136b extends toward the center of the region R1 for connecting between the first connecting pattern 136a and the second set of the second vias 134 in a grid form.

Figure 2F:
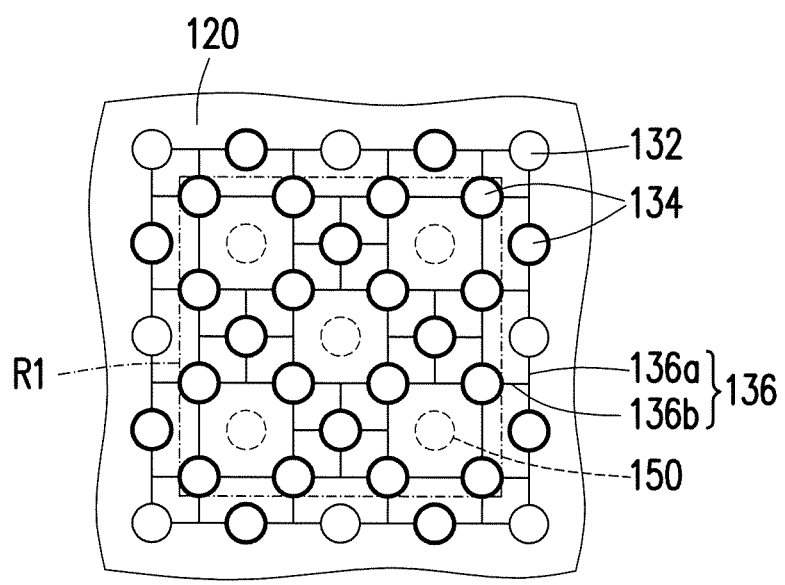

Referring to FIG. 2F, in the embodiment, the first vias 132 and a first set of the second vias 134 surrounds the region R1 of the passivation layer 120 while a second set of the second vias 134 are disposed within the region R1 and surrounded by the first vias 132 and the first set of the second vias 134. As such, the first connecting pattern 136a surrounds the region R1 of the passivation layer 120 to connect the first vias 132 and the first set of the second vias 134. The second connecting pattern 136b extends toward the center of the region R1 for connecting between the first connecting pattern 136a and the second set of the second vias 134 in a grid form, and for connecting between the second connecting pattern 136b and the second set of the second vias 134 in a grid form. It is noted that the disclosure does not limit the size and the shape of the region R1. Sizes and shapes of the regions R1 illustrated in FIG. 2A to FIG. 2F may be the same or may be different from one another.

Figure 3A:
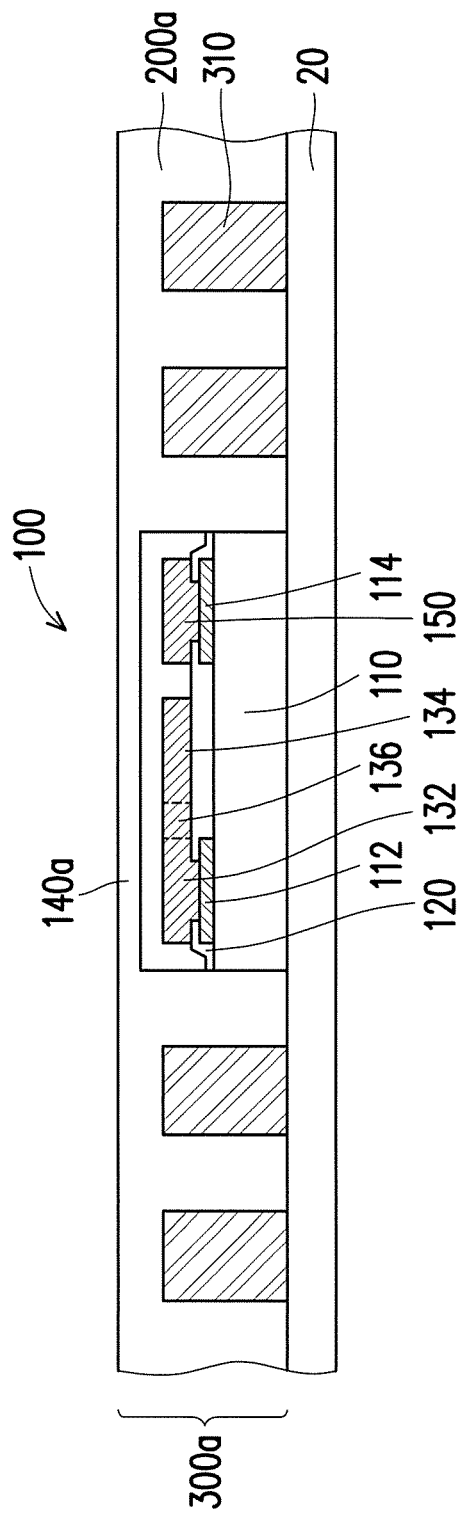
FIG. 3A to FIG. 3C illustrate schematic cross sectional views of a manufacturing process of a semiconductor package according to some exemplary embodiments of the present disclosure.
Figure 3B:
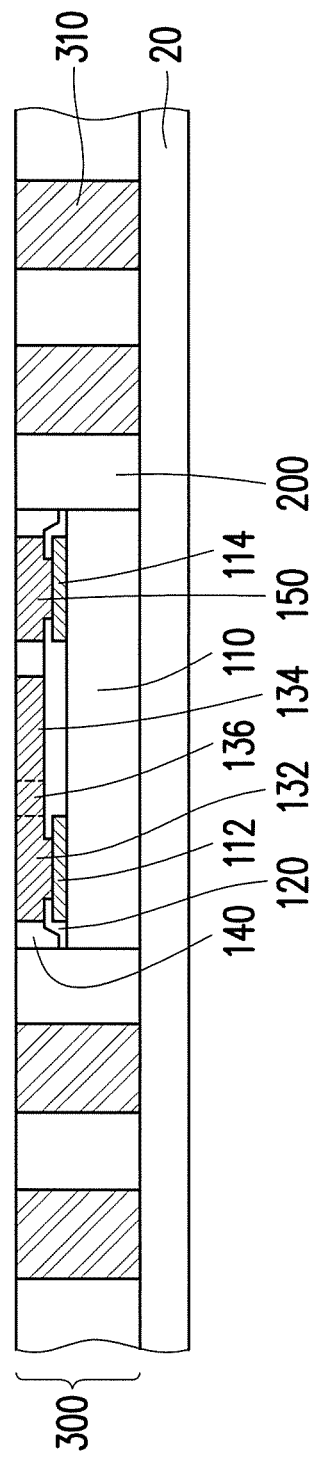
Figure 3C:
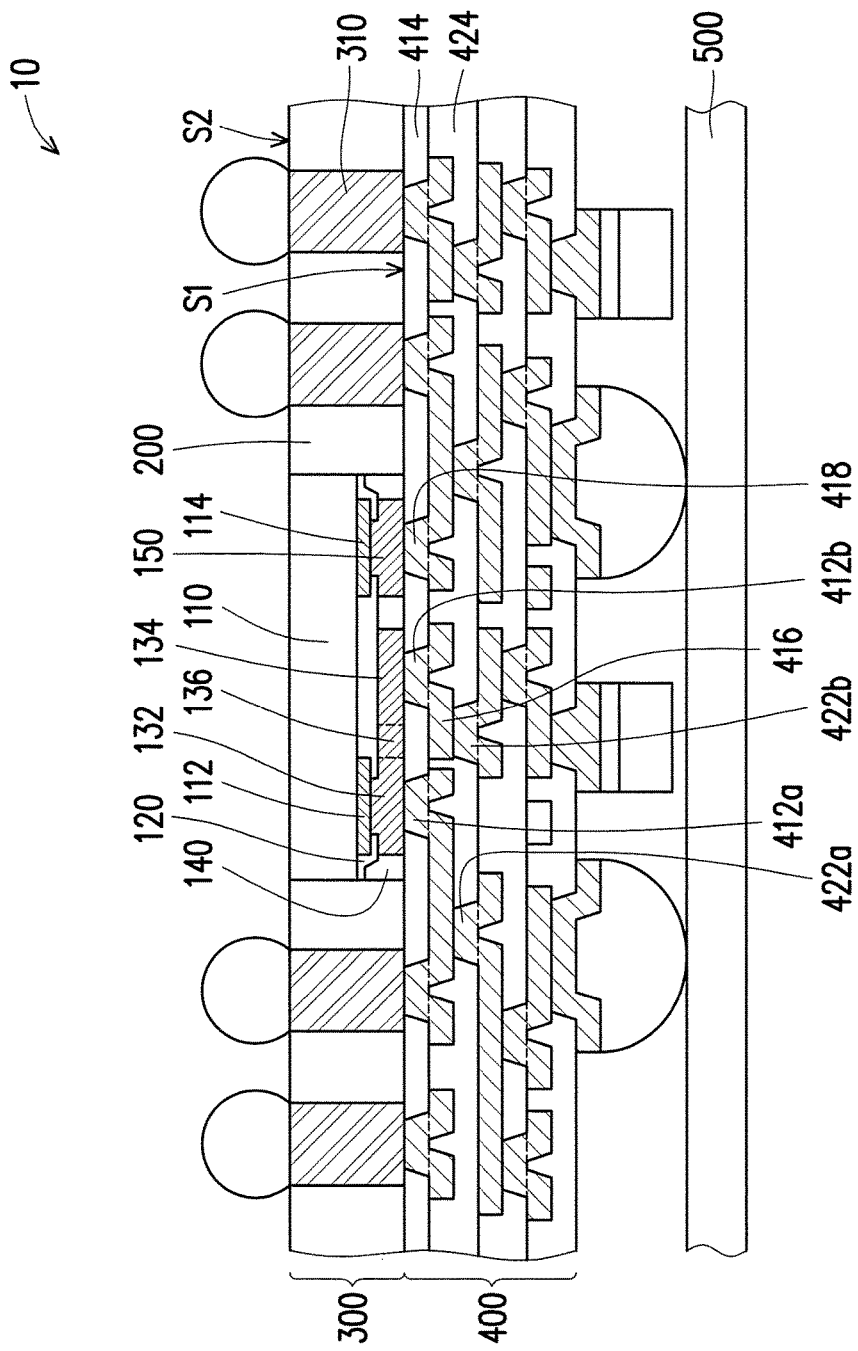

FIG. 3A to FIG. 3C illustrate schematic cross sectional views of a manufacturing process of a semiconductor package according to some exemplary embodiments of the present disclosure. The same or similar elements described in FIG. 1 and FIG. 2 will use the same reference numbers, and certain details or descriptions of the same elements will not be repeated herein. In some embodiments, one die is shown to represent plural dies of the wafer, and one single package is shown to represent plural semiconductor packages. Referring to FIG. 3A to FIG. 3C, in some embodiments the semiconductor device 100 described in FIG. 1 may be applied to an InFO (Integrated Fan-Out) package to form the semiconductor package 10 shown in FIG. 3C, and the manufacturing process are described as follows. It is noted that the third vias 160 and the second pads 113 are omitted in FIG. 3A to FIG. 3C for sake of simplicity of the drawings.

Referring to FIG. 3A, in exemplary embodiments, a plurality of through interlayer vias 310 may be formed on a carrier 20, and the semiconductor device 100 shown in FIG. 1 may be disposed on the carrier 20. It is noted that, in this stage, another passivation layer 140a may cover the active surface of the die 110. In some embodiments, the passivation layer 140a may cover the conductive frame 130. Then, a molding compound 200a encapsulates the through interlayer vias 310 and the semiconductor device 100 to form the molded semiconductor device 300a shown in FIG. 3A.

Referring to FIG. 3B, a thinning process may be performed on the molded semiconductor device 300a to expose top surfaces of the through interlayer vias 310, the first vias 132, the second vias 134 and the fourth vias 150 to form the molded semiconductor device 300 shown in FIG. 3B. In the embodiment, the molding compound 200 exposes the top surfaces of the through interlayer vias 310 and the passivation layer 140 exposes the first vias 132, the second vias 134 and the fourth vias 150. In some embodiments, the thinning process may include a grinding process or a chemical mechanical polishing (CMP) process. After the thinning process, a cleaning step may be performed optionally to clean and remove the residue generated from the thinning step. However, the disclosure is not limited thereto, and the thinning process may be performed through any other suitable method.

Referring to FIG. 3C, a redistribution structure 400 may be formed on the molded semiconductor device 300. Solder balls and other components may be formed optionally to be electrically connected to the redistribution structure 400 and/or the through interlayer vias 310. The carrier 20 may be removed, and the manufacturing process of the semiconductor package 10 may be substantially done.

Accordingly, the semiconductor package 10 may include a molded semiconductor device 300 and a redistribution structure 400. The molded semiconductor device 300 may include the semiconductor device 100 described above and a molding compound 200 at least encapsulating side surfaces of the semiconductor device 100. In some embodiments, the molding compound 200 may include, for example, an epoxy resin, or any other suitable type of molding material. The redistribution structure 400 is disposed on the molded semiconductor device 300. In some embodiments, the redistribution structure 400 is disposed on a first side S1 of the molded semiconductor device 300 where the first vias 132 and the second vias 134 are exposed. The redistribution structure 400 includes a plurality of first redistribution vias 412a, 412b. In some embodiments, a first set of the first redistribution vias 412a are connected to the first vias 132 and a second set of the first redistribution vias 412b are connected to the second vias 134. In addition, the first redistribution structure 400 may further include a third set of the first redistribution vias connected to the third vias 160.

In some embodiments, the molded semiconductor device 300 may further include the through interlayer vias 310 extending through the molding compound 200 for being electrically connected to the redistribution structure 400. In some embodiments, both ends of the through interlayer vias 310 may be exposed from the molding compound 200 as shown in FIG. 3C for electrically connecting conductive components (e.g. redistribution circuit) on a first side S1 and conductive components (e.g. conductive balls) on a second side S2 (opposite to the first side S1) of the molded semiconductor device 300. Accordingly, the semiconductor package 10 may be electrically connected to other electronic components via the first side S1/the second side S2 of the molded semiconductor device 300. In some embodiments, the semiconductor package 10 may be electrically connected to a printed circuit board 500 through a plurality of solder balls.

In some embodiments, the redistribution structure 400 may further include a first dielectric layer 414, a first redistribution circuit 416, a second dielectric layer 424 and a plurality of second redistribution vias 422a, 422b. The first dielectric layer 414 is disposed on the first side S1 of the molded semiconductor device 300 and the first redistribution vias 412a, 412b penetrate the first dielectric layer 414 to connect the first vias 132 and the second vias 134. In some embodiments, the redistribution structure 400 may further include a plurality of ground redistribution vias 418 for connecting the fourth vias 150. The first redistribution circuit 416 is disposed on the first dielectric layer 414 and connects the first redistribution vias 412a, 412b. The second dielectric layer 424 is disposed on the first dielectric layer 414, and the second redistribution vias 422a, 422b penetrate the second dielectric layer 424 and connect the first redistribution circuit 416. Similarly, more dielectric layers, redistribution vias and redistribution circuits may be continuously stacked on the second dielectric layer 424 to form multiple layers of the redistribution structure 400, and the redistribution vias corresponding to the second vias 134 may be connected to one another sequentially to further enhance the heat dissipation efficiency of the semiconductor package 10. It is noted that there are four layers of redistribution circuits and redistribution vias in the redistribution structure 400 depicted in FIG. 3C for illustration purpose, but the number of the layers in the redistribution structure 400 is not limited thereto.

Figure 4:
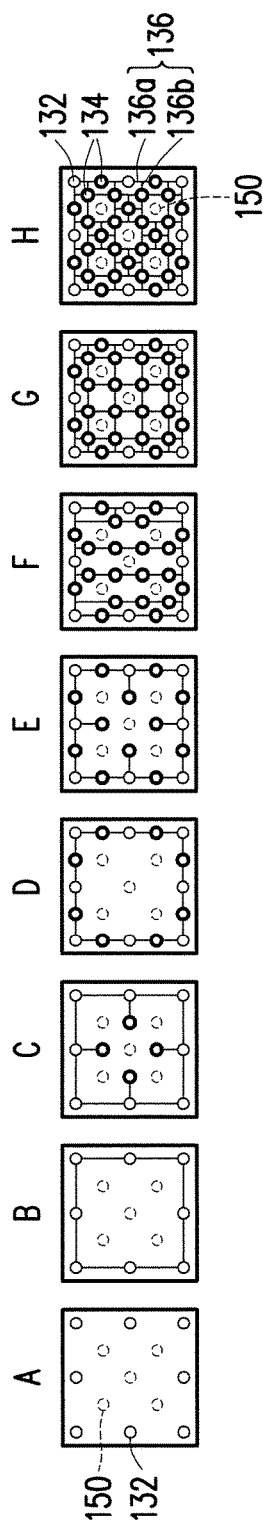
FIG. 4 illustrates thermal resistance simulation results for different semiconductor packages according to some exemplary embodiments of the present disclosure.

FIG. 4 illustrates thermal resistance simulation results for different semiconductor packages according to some exemplary embodiments of the present disclosure. The table in FIG. 4 shows the simulation results for reduction of the thermal resistance in different semiconductor packages (illustrated in top views A to H of FIG. 4) with different metal densities. Top views A to H of FIG. 4 illustrate different layouts of the conductive frame 130 and the fourth vias 150 on the passivation layer 120 (denoted as layer "PM0" in row (b) of the table) in different semiconductor packages. The vias depicted in thin line represent the first vias 132, the vias depicted in thick line represent the second vias 134, and the vias depicted in dotted line represent the fourth vias 150. The same or similar elements described in FIG. 2A to FIG. 2F will use the same reference numbers, and certain details or descriptions of the same elements will not be repeated herein.

Accordingly, the column (1) to column (8) show the characteristics of the semiconductor packages in top views A to H of FIG. 4 respectively. The layout of the conductive frame 130 shown in top view C of FIG. 4 is the same as the layout shown in FIG. 2C, so the detail description of same or similar features may be omitted, and the same or similar reference numbers denote the same or like components. As such, the metal density on the passivation layer 120 is significantly increased (compared to the metal density of the referential semiconductor package in top view A of FIG. 4). In addition, in the embodiment, the number of the second vias 134 is illustrated as 4. With the configuration, referring to column (3) of the table in FIG. 4, the metal density on the passivation layer 120 (i.e. "PM0" in row (b) of the table) is 19.5%. Accordingly, the thermal resistance of the semiconductor package is reduced 12% (compared to the thermal resistance of the referential semiconductor package in top view A of FIG. 4).

The layout of the conductive frame 130 shown in top view D of FIG. 4 is the same as the layout shown in FIG. 2B, so the detail description of same or similar features may be omitted, and the same or similar reference numbers denote the same or like components. In the embodiment, the number of the second vias 134 is increased up to 8. With such configuration, referring to column (4) of the table in FIG. 4, the metal density on the passivation layer 120 (i.e. "PM0" in row (b) of the table) is 17.6%, and the thermal resistance of the semiconductor package is reduced 16.4% (compared to the thermal resistance of the referential semiconductor package in top view A of FIG. 4).

The layout of the conductive frame 130 shown in top view E of FIG. 4 is the same as the layout shown in FIG. 2A, so the detail description of same or similar features may be omitted, and the same or similar reference numbers denote the same or like components. Accordingly, referring to column (5) of the table in FIG. 4, the metal density on the passivation layer 120 (i.e. "PM0" in row (b) of the table) is 23.5%, and the thermal resistance of the semiconductor package is reduced 23.2% (compared to the thermal resistance of the referential semiconductor package in top view A of FIG. 4).

The layout of the conductive frame 130 shown in top view F of FIG. 4 is the same as the layout shown in FIG. 2D, so the detail description of same or similar features may be omitted, and the same or similar reference numbers denote the same or like components. In the embodiment, the number of the second vias 134 increases up to 21. With such configuration, referring to column (6) of the table in FIG. 4, the metal density on the passivation layer 120 (layer PM0) is 30.8%, and the thermal resistance of the semiconductor package is reduced 34% (compared to the thermal resistance of the referential semiconductor package in top view A of FIG. 4).

With the similar concepts, the number of the second vias 134 may continuously increase and the connecting pattern 136 is configured to connect between the first vias 132 and the second vias 134, so as to continuously increase the metal density and thereby continuously enhanced the heat dissipation efficiency of the semiconductor device and the semiconductor packages having the same. The embodiments illustrated in top view A to top view H of FIG. 4 are merely for illustration purpose, the disclosure does not limit the number of the second vias 134 and the layout of the conductive frame 130 on the passivation layer 120.

Figure 5:
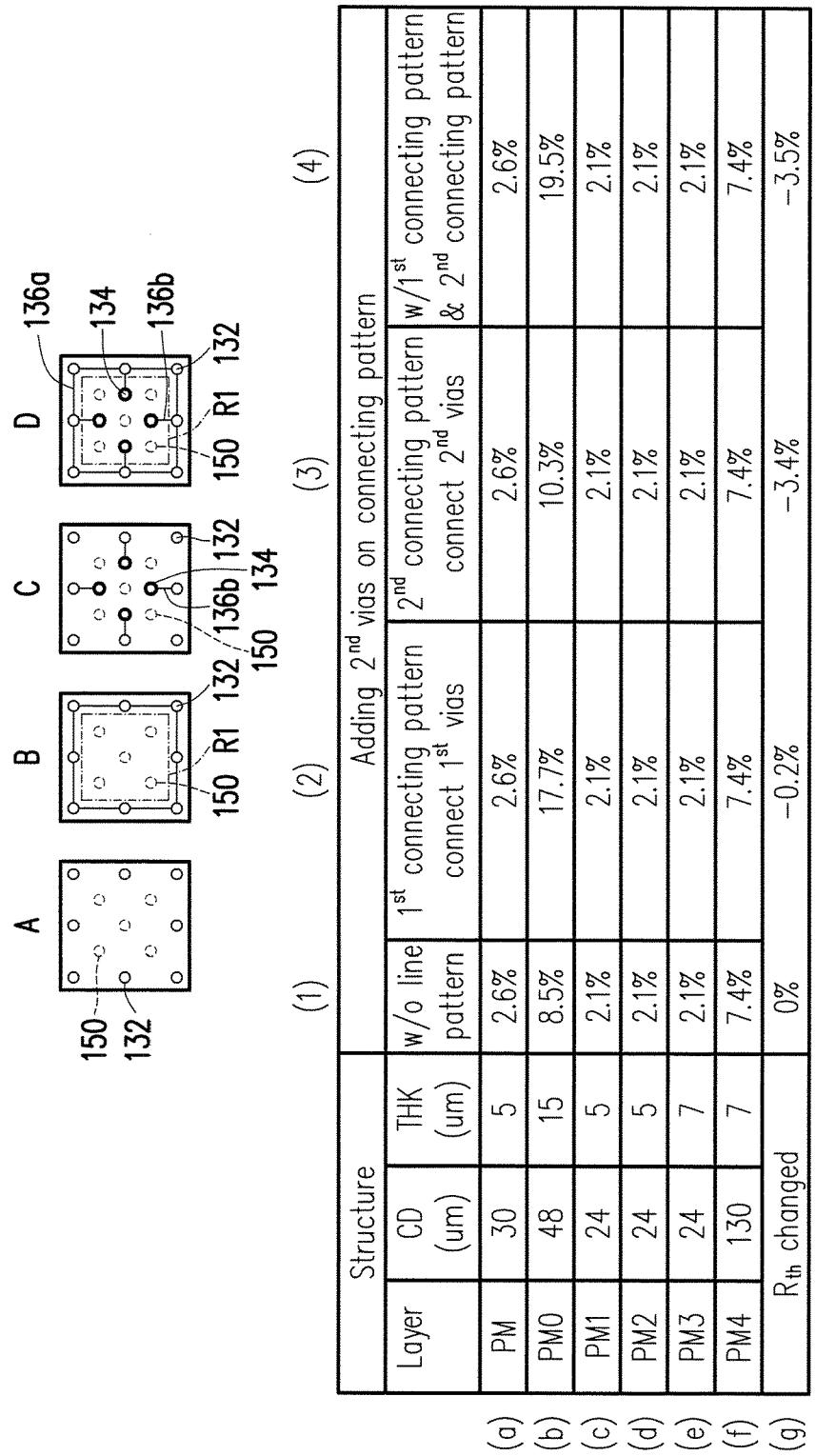
FIG. 5 illustrates thermal resistance simulation results for different semiconductor packages according to some exemplary embodiments of the present disclosure.

FIG. 5 illustrates thermal resistance simulation results for different semiconductor packages according to some exemplary embodiments of the present disclosure. The table in FIG. 5 shows the simulation results for reduction of the thermal resistance in different semiconductor packages (illustrated in top views A to D of FIG. 5) with different metal densities. Top views A to D of FIG. 5 illustrate different layouts of the conductive frame 130 and the fourth vias 150 on the passivation layer 120 (denoted as layer "PM0" in the table) in different semiconductor packages. The vias depicted in thin line represent the first vias 132, the vias depicted in thick line represent the second vias 134, and the vias depicted in dotted line represent the fourth vias 150. The same or similar elements described in FIG. 2 will use the same reference numbers, and certain details or descriptions of the same elements will not be repeated herein.

Accordingly, in top view B of FIG. 5, the first vias 132 surround a region R1 of the passivation layer 120 while the second vias 134 are disposed within the region R1 and surrounded by the first vias 132. As such, the conductive frame 130 includes the first connecting pattern 136a surround the region R1 of the passivation layer 120 to connect the first vias 132, but does not include the second connecting pattern 136b to connect the second vias 134. With such configuration, referring to column (2) of the table in FIG. 5, the metal density on the passivation layer 120 (layer PM0) is 17.7% while the thermal resistance of the semiconductor package is reduced 0.2% (compared to the thermal resistance of the referential semiconductor package in top view A of FIG. 5).

In one embodiment shown in top view C of FIG. 5, the conductive frame 130 merely include the second connecting pattern 136b to connect the second vias 134, and does not include the first connecting pattern 136a surround a region of the passivation layer 120 to connect the first vias 132. With such configuration, referring to column (3) of the table in FIG. 5, the metal density on the passivation layer 120 (layer PM0) in FIG. 5C is 10.3%, which is actually less than the metal density shown in FIG. 5B. However, the thermal resistance of the semiconductor package is significantly reduced 3.4%. In addition, in top view D of FIG. 5, the conductive frame 130 include both the first connecting pattern 136a and the second connecting pattern 136b. With such configuration, referring to column (4) of the table in FIG. 5, the metal density on the passivation layer 120 (layer PM0) is 19.5% while the thermal resistance of the semiconductor package is reduced 3.5% (compared to the thermal resistance of the referential semiconductor package in top view A of FIG. 5). Therefore, the second connecting pattern 136a for connecting between the first vias 132 and the second vias 134 plays a significant role in reducing the thermal resistance.

Figure 6:
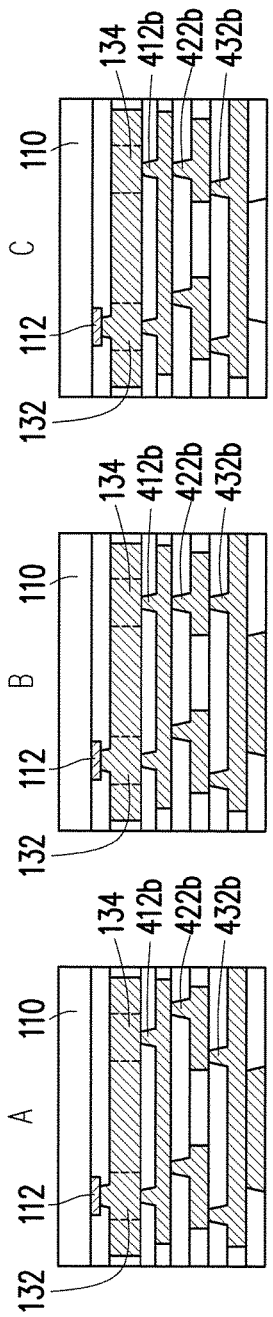
FIG. 6 illustrates thermal resistance simulation results for different semiconductor packages according to some exemplary embodiments of the present disclosure.

FIG. 6 illustrates thermal resistance simulation results for different semiconductor packages according to some exemplary embodiments of the present disclosure. The table in FIG. 6 shows the simulation results for reduction of the thermal resistance in different semiconductor packages (illustrated in cross sections A to C of FIG. 6) with different arrangement of the redistribution vias in redistribution structure 400. The same or similar elements described in FIG. 3 will use the same reference numbers, and certain details or descriptions of the same elements will not be repeated herein.

In the embodiments shown in cross section A of FIG. 6, the redistribution structure 400 includes the second set of the first redistribution vias 412b on the first layer, the second redistribution vias 422b on the second layer and a plurality of third redistribution vias 432b on a third layer of the redistribution structure 400. The second set of the first redistribution vias 412b connecting the second vias 134 are not aligned with the second redistribution vias 422b and the third redistribution vias 432b, and the thermal resistance of the semiconductor package in cross section A of FIG. 6 is deemed as the referential thermal resistance.

Accordingly, in the embodiment shown in cross section B of FIG. 6, the second set of the first redistribution vias 412b are aligned with at least a set of the second redistribution vias 422b and also aligned with at least a set of the third redistribution vias 432b. With such configuration, referring to column (2) of the table in FIG. 6, the thermal resistance of the semiconductor package in cross section B of FIG. 6 is reduced 37.3% (compared to the thermal resistance of the referential semiconductor package in cross section A of FIG. 6).

In the embodiment shown in cross section C of FIG. 6, the second set of the first redistribution vias 412b are aligned with at least a set of the second redistribution vias 422b and not aligned with the third redistribution vias 432b. With such configuration, referring to column (3) of the table in FIG. 6, the thermal resistance of the semiconductor package in cross section C of FIG. 6 is reduced 22.2% (compared to the thermal resistance of the referential semiconductor package in cross section A of FIG. 6), which is still favorable for heat dissipation. Therefore, in some embodiments, the second set of the first redistribution vias 412b may be aligned with at least a set of the second redistribution vias 422b to further enhance the heat dissipation efficiency of the semiconductor package.

According to some embodiments, a semiconductor device includes a die, a passivation layer, a plurality of first electrical conductive vias, a plurality of second electrical conductive vias, a plurality of thermal conductive vias, and a connecting pattern. The die includes a plurality of first pads and a plurality of second pads. The passivation layer is disposed on the die. The first electrical conductive vias and the second electrical conductive vias extend through the passivation layer and contact the first pads and the second pads respectively. The thermal conductive vias are disposed over the passivation layer, wherein each of the thermal conductive vias is spaced apart from the first and second electrical conductive vias. The connecting pattern is disposed on the passivation layer and connects the first electrical conductive vias and the thermal conductive vias. The thermal conductive vias are connected to the first pads through the connecting pattern and the first electrical conductive vias.

According to some embodiments, the first electrical conductive vias are disposed right above the first pads respectively, and the second electrical conductive vias are disposed right above the second pads respectively.

According to some embodiments, the connecting pattern surrounds a region of the passivation layer to connect the first electrical conductive vias and at least a set of the thermal conductive vias.

According to some embodiments, the connecting pattern includes a first connecting pattern and a second connecting pattern. The first connecting pattern surrounds a region of the passivation layer to connect the first electrical conductive vias. The second connecting pattern connects the first electrical conductive vias and the thermal conductive vias, wherein the thermal conductive vias are disposed within the region and surrounded by the first electrical conductive vias.

According to some embodiments, the connecting pattern includes a first connecting pattern and a second connecting pattern. The first connecting pattern surrounds a region of the passivation layer to connect the first electrical conductive vias and a first set of the thermal conductive vias. The second connecting pattern connects the first electrical conductive vias and a second set of the thermal conductive vias, wherein the second set of the thermal conductive vias are disposed within the region and surrounded by the first electrical conductive vias and the first set of the thermal conductive vias.

According to some embodiments, the connecting pattern includes a first connecting pattern and a second connecting pattern. The first connecting pattern surrounds a region of the passivation layer to connect the first electrical conductive vias and a first set of the thermal conductive vias. The second connecting pattern connects the first connecting pattern and a second set of the thermal conductive vias, wherein the second set of the thermal conductive vias are disposed within the region and surrounded by the first electrical conductive vias and the first set of the thermal conductive vias.

According to some embodiments, the semiconductor device further includes a plurality of ground vias isolated from the first electrical conductive vias and the thermal conductive vias, and contacting a plurality of ground pads of the die. The first pads are a plurality of power pads of the die and the second pads are a plurality of signal pads of the die.

According to some embodiments, a semiconductor device includes a die, a passivation layer, a conductive frame and a plurality of third vias. The die includes a plurality of first pads and a plurality of second pads. The passivation layer is disposed on the die and exposes the first pads and the second pads. The conductive frame is disposed on the passivation layer and includes a plurality of first vias penetrating the passivation layer to contact the first pads respectively and a plurality of second vias entirely disposed on top of the passivation layer and connected to the first pads through the conductive frame. The third vias penetrate the passivation layer to contact the second pads respectively.

According to some embodiments, the first vias are disposed right above the first pads respectively, and the third vias are disposed right above the second pads respectively.

According to some embodiments, the conductive frame surrounds a region of the passivation layer.

According to some embodiments, the conductive frame surrounds a region of the passivation layer to connect the first vias and extends toward a center of the region to connect the second vias.

According to some embodiments, the conductive frame surrounds a region of the passivation layer to connect the first vias and a first set of the second vias and extends toward a center of the region to connect a second set of the second vias.

According to some embodiments, the semiconductor device further includes a plurality of fourth vias isolated from the conductive frame and contacting a plurality of ground pads of the die, and the second pads are a plurality of signal pads of the die.

According to some embodiments, a semiconductor package includes a molded semiconductor device and a redistribution structure. The molded semiconductor device includes a semiconductor device and a molding compound encapsulating the semiconductor device. The semiconductor device includes a die, a passivation layer, a conductive frame and a plurality of third vias. The die includes a plurality of first pads and a plurality of second pads. The passivation layer is disposed on the die and exposes the first pads and the second pads. The conductive frame is disposed on the passivation layer and includes a plurality of first vias penetrating the passivation layer to contact the first pads respectively and a plurality of second vias disposed on top of the passivation layer and connected to the first pads through the conductive frame. The third vias penetrate the passivation layer to contact the second pads. The redistribution structure is disposed on the molded semiconductor device and includes a plurality of first redistribution vias, wherein a first set of the first redistribution vias connect the first vias and a second set of the first redistribution vias connect the second vias.

According to some embodiments, the first vias are disposed right above the first pads respectively, and the second vias are disposed right above the second pads respectively.

According to some embodiments, the conductive frame surrounds a region of the passivation layer.

According to some embodiments, the conductive frame surrounds a region of the passivation layer to connect the first vias and extends toward a center of the region to connect the second vias.

According to some embodiments, the conductive frame surrounds a region of the passivation layer to connect the first vias and a first set of the second vias and extends toward the center of the region to connect a second set of the second vias.

According to some embodiments, the semiconductor device further includes a plurality of fourth vias isolated from the conductive frame and contacting a plurality of ground pads of the die, wherein the first pads are a plurality of power pads of the die, and the second pads are a plurality of signal pads of the die.

According to some embodiments, the redistribution structure further includes a first dielectric layer, a first redistribution circuit, a second dielectric layer and a plurality of second redistribution vias. The first dielectric layer is disposed on the molded semiconductor device, wherein the first redistribution vias penetrate the first dielectric layer. The first redistribution circuit is disposed on the first dielectric layer and connecting the first redistribution vias. The second dielectric layer is disposed on the first dielectric layer. The second redistribution vias penetrate the second dielectric layer and connect the first redistribution circuit, wherein the second set of the first redistribution vias are aligned with a set of the second redistribution vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a die, comprising a plurality of first pads and a plurality of second pads;
   a passivation layer, disposed on the die;
   a plurality of first electrical conductive vias and a plurality of second electrical conductive vias, extending through the passivation layer and contacting the first pads and the second pads respectively;
   a plurality of thermal conductive vias, disposed over the passivation layer, wherein each of the thermal conductive vias is spaced apart from the first and second electrical conductive vias; and
   a connecting pattern, disposed on the passivation layer and connecting the thermal conductive vias and the first electrical conductive vias, wherein the thermal conductive vias are connected to the first pads through the connecting pattern and the first electrical conductive vias.

2. The semiconductor device as claimed in claim 1, wherein the first electrical conductive vias are disposed right above the first pads respectively and the second electrical conductive vias are disposed right above the second vias respectively.

3. The semiconductor device as claimed in claim 1, wherein the connecting pattern surrounds a region of the passivation layer to connect the electrical conductive vias and at least a set of the thermal conductive vias.

4. The semiconductor device as claimed in claim 1, wherein the connecting pattern comprises:
   a first connecting pattern, surrounding a region of the passivation layer to connect the first electrical conductive vias; and
   a second connecting pattern, connecting the first electrical conductive vias and the thermal conductive vias, wherein the thermal conductive vias are disposed within the region and surrounded by the electrical conductive vias.

5. The semiconductor device as claimed in claim 1, wherein the connecting pattern comprises:
   a first connecting pattern, surrounding a region of the passivation layer to connect the first electrical conductive vias and a first set of the thermal conductive vias; and
   a second connecting pattern, connecting the first electrical conductive vias and a second set of the thermal conductive vias, wherein the second set of the thermal conductive vias are disposed within the region surrounded by the first electrical conductive vias and the first set of the thermal conductive vias.

6. The semiconductor device as claimed in claim 1, wherein the connecting pattern comprises:
   a first connecting pattern, surrounding a region of the passivation layer to connect the first electrical conductive vias and a first set of the thermal conductive vias; and
   a second connecting pattern, connecting the first connecting pattern and a second set of the thermal conductive vias, wherein the second set of the thermal conductive vias are surrounded by the first electrical conductive vias and the first set of the thermal conductive vias.

7. The semiconductor device as claimed in claim 1, further comprising a plurality of ground vias isolated from the first electrical conductive vias and the thermal conductive vias, and contacting a plurality of ground pads of the die, wherein the first pads are a plurality of power pads of the die and the second pads are a plurality of signal pads of the die.

8. A semiconductor device, comprising:
   a die, comprising a plurality of first pads and a plurality of second pads;
   a passivation layer, disposed on the die and exposing the first pads and the second pads;
   a conductive frame, disposed on the passivation layer and comprising a plurality of first vias penetrating the passivation layer to contact the first pads respectively and a plurality of second vias entirely disposed on top of the passivation layer and connected to the first pads through the conductive frame; and
   a plurality of third vias penetrating the passivation layer to contact the second pads respectively.

9. The semiconductor device as claimed in claim 8, wherein the first vias are disposed right above the first pads respectively, and the third vias are disposed right above the second pads respectively.

10. The semiconductor device as claimed in claim 8, wherein the conductive frame surrounding a region of the passivation layer.

11. The semiconductor device as claimed in claim 8, wherein the conductive frame surrounding a region of the passivation layer to connect the first vias and extends toward a center of the region to connect the second vias.

12. The semiconductor device as claimed in claim 8, wherein the conductive frame surrounding a region of the passivation layer to connect the first vias and a first set of the second vias and extends toward a center of the region to connect a second set of the second vias.

13. The semiconductor device as claimed in claim 8, further comprising a plurality of fourth vias isolated from the conductive frame and contacting a plurality of ground pads of the die, wherein the first pads are a plurality of power pads of the die, and the second pads are a plurality of signal pads of the die.

14. A semiconductor package, comprising:
    a molded semiconductor device comprising a semiconductor device and a molding compound encapsulating the semiconductor device, the semiconductor device comprising:
        a die, comprising a plurality of first pads and a plurality of second
        a passivation layer, disposed on the die and exposing the first pads and the second pads;
        a conductive frame, disposed on the passivation layer and comprising a plurality of first vias penetrating the passivation layer to contact the first pads respectively and a plurality of second vias disposed on top of the passivation layer and connected to the first pads through the conductive frame; and
        a plurality of third vias penetrating the passivation layer to contact the second pads; and
    a redistribution structure, disposed on the molded semiconductor device and comprising a plurality of first redistribution vias, wherein a first set of the first redistribution vias connect the first vias and a second set of the first redistribution vias connect the second vias.

15. The semiconductor package as claimed in claim 14, wherein the first vias are disposed right above the first pads respectively, and the second vias are disposed right above the second pads respectively.

16. The semiconductor package as claimed in claim 14, wherein the conductive frame surrounds a region of the passivation layer.

17. The semiconductor package as claimed in claim 14, wherein the conductive frame surrounds a region of the passivation layer to connect the first vias and extends toward a center of the region to connect the second vias.

18. The semiconductor package as claimed in claim 14, wherein the conductive frame surrounds a region of the passivation layer to connect the first vias and a first set of the second vias and extends toward a center of the region to connect a second set of the second vias.

19. The semiconductor package as claimed in claim 14, wherein the semiconductor device further comprising a plurality of fourth vias isolated from the conductive frame, and contacting a plurality of ground pads of the die, wherein the first pads are a plurality of power pads of the die, and the second pads are a plurality of signal pads of the die.

20. The semiconductor package as claimed in claim 14, wherein the redistribution structure further comprises:
    a first dielectric layer, disposed on the molded semiconductor device, wherein the first redistribution vias penetrate the first dielectric layer;
    a first redistribution circuit, disposed on the first dielectric layer and connecting the first redistribution vias;
    a second dielectric layer, disposed on the first dielectric layer; and
    a plurality of second redistribution vias, penetrating the second dielectric layer and connecting the first redistribution circuit, wherein the second set of the first redistribution vias are aligned with a set of the second redistribution vias.

* * * * *